United States Patent
Mokhlesi et al.

(10) Patent No.: US 7,590,002 B2
(45) Date of Patent: *Sep. 15, 2009

(54) RESISTANCE SENSING AND COMPENSATION FOR NON-VOLATILE STORAGE

(75) Inventors: Nima Mokhlesi, Los Gatos, CA (US); Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 11/617,972

(22) Filed: Dec. 29, 2006

(65) Prior Publication Data

US 2008/0158967 A1    Jul. 3, 2008

(51) Int. Cl.
  *G11C 16/04*    (2006.01)
(52) U.S. Cl. .............................. 365/185.17; 365/185.18; 365/185.02
(58) Field of Classification Search ............. 365/185.17, 365/185.18, 185.02
  See application file for complete search history.

(56) References Cited

U.S. PATENT DOCUMENTS

| 5,532,962 | A  | 7/1996  | Auclair    |
|-----------|----|---------|------------|
| 5,539,690 | A  | 7/1996  | Talreja    |
| 5,657,332 | A  | 8/1997  | Auclair    |
| 5,764,572 | A  | 6/1998  | Hammick    |
| 5,862,074 | A  | 1/1999  | Park       |
| 5,867,429 | A  | 2/1999  | Chen       |
| 5,943,260 | A  | 8/1999  | Hirakawa   |
| 6,044,019 | A  | 3/2000  | Cernea     |
| 6,046,935 | A  | 4/2000  | Takeuchi   |
| 6,154,157 | A  | 11/2000 | Wong       |
| 6,160,739 | A  | 12/2000 | Wong       |
| 6,175,522 | B1 | 1/2001  | Fang       |
| 6,181,599 | B1 | 1/2001  | Gongwer    |
| 6,222,762 | B1 | 4/2001  | Guterman   |
| 6,259,632 | B1 | 7/2001  | Khouri     |
| 6,285,593 | B1 | 9/2001  | Wong       |
| 6,310,809 | B1 | 10/2001 | Roohparvar |
| 6,345,000 | B1 | 2/2002  | Wong       |
| 6,456,528 | B1 | 9/2002  | Chen       |
| 6,462,988 | B1 | 10/2002 | Harari     |
| 6,504,762 | B1 | 1/2003  | Harari     |
| 6,522,580 | B2 | 2/2003  | Chen       |
| 6,532,556 | B1 | 3/2003  | Wong       |
| 6,535,423 | B2 | 3/2003  | Trivedi    |

(Continued)

FOREIGN PATENT DOCUMENTS

EP    01271553    1/2003

(Continued)

OTHER PUBLICATIONS

U.S. Appl. No. 11/617,981, filed Dec. 29, 2006.

(Continued)

*Primary Examiner*—Huan Hoang
(74) *Attorney, Agent, or Firm*—Vierra Magen Marcus & DeNiro LLP

(57) ABSTRACT

When reading data from a non-volatile storage element that is part of a group of connected non-volatile storage elements, resistance information is measured for the group. One or more read parameters are set based on the measured resistance information. The read process is then performed using the one or more parameters.

25 Claims, 13 Drawing Sheets

U.S. PATENT DOCUMENTS

| | | | |
|---|---|---|---|
| 6,542,407 B1 | 4/2003 | Chen |
| 6,570,785 B1 | 5/2003 | Mangan |
| 6,570,790 B1 | 5/2003 | Harari |
| 6,584,594 B1 | 6/2003 | Walters, Jr. |
| 6,643,188 B2 | 11/2003 | Tanaka |
| 6,657,891 B1 | 12/2003 | Shibata |
| 6,717,847 B2 | 4/2004 | Chen |
| 6,717,851 B2 | 4/2004 | Mangan |
| 6,760,068 B2 | 7/2004 | Petropoulous |
| 6,771,536 B2 | 8/2004 | Li |
| 6,781,877 B2 | 8/2004 | Cernea |
| 6,807,095 B2 | 10/2004 | Chen |
| 6,842,364 B1 * | 1/2005 | Hilton et al. ............... 365/158 |
| 6,859,397 B2 | 2/2005 | Lutze |
| 6,870,766 B2 | 3/2005 | Cho |
| 6,870,768 B2 | 3/2005 | Cernea |
| 6,888,758 B1 | 5/2005 | Hemink |
| 6,956,770 B2 | 10/2005 | Khalid |
| 7,009,901 B2 | 3/2006 | Baker |
| 7,020,017 B2 | 3/2006 | Chen |
| 7,057,939 B2 | 6/2006 | Li |
| 7,061,071 B2 | 6/2006 | Gilton |
| 7,102,913 B2 | 9/2006 | Nazarian |
| 7,130,235 B2 | 10/2006 | Perner |
| 7,254,052 B2 * | 8/2007 | Liaw ..................... 365/148 |
| 2002/0051383 A1 | 5/2002 | Mangan |
| 2003/0112663 A1 | 6/2003 | Quader |
| 2003/0128586 A1 | 7/2003 | Chen |
| 2003/0137873 A1 | 7/2003 | Kawamura |
| 2003/0137888 A1 | 7/2003 | Chen |
| 2003/0161182 A1 | 8/2003 | Li |
| 2003/0218920 A1 | 11/2003 | Harari |
| 2004/0012998 A1 | 1/2004 | Chien |
| 2004/0027865 A1 | 2/2004 | Mangan |
| 2004/0042270 A1 | 3/2004 | Huang |
| 2004/0047182 A1 | 3/2004 | Chernea |
| 2004/0057283 A1 | 3/2004 | Cernea |
| 2004/0057285 A1 | 3/2004 | Cernea |
| 2004/0057287 A1 | 3/2004 | Cernea |
| 2004/0057318 A1 | 3/2004 | Cernea |
| 2004/0060031 A1 | 3/2004 | Cernea |
| 2004/0062075 A1 | 4/2004 | Reohr |
| 2004/0079988 A1 | 4/2004 | Harari |
| 2004/0109357 A1 | 6/2004 | Cernea |
| 2004/0156241 A1 | 8/2004 | Mokhlesi |
| 2004/0179404 A1 | 9/2004 | Quader |
| 2004/0190337 A1 | 9/2004 | Chen |
| 2005/0157552 A1 | 7/2005 | Hemink |
| 2005/0174854 A1 | 8/2005 | Tsushima |
| 2005/0180216 A1 | 8/2005 | Lowrey |
| 2007/0279995 A1 | 12/2007 | Mokhlesi |

FOREIGN PATENT DOCUMENTS

| | | |
|---|---|---|
| EP | 01329898 | 7/2003 |

OTHER PUBLICATIONS

U.S. Appl. No. 60/791,365, filed Apr. 12, 2006, Reducing the Impact of Program Disturb for a Word Line, by Gerrit Jan Hemink.

International Search Report, dated Oct. 22, 2008, PCT Appl. PCT/US2007/088786, filed Dec. 24, 2007.

Written Opinion of the International Searching Authority, dated Oct. 22, 2008, PCT Appl. PCT/US2007/088786, filed Dec. 24, 2007.

Office Action dated Jul. 25, 2008, U.S. Appl. No. 11/617,981, filed Dec. 29, 2006.

Response to Office Action dated Aug. 22, 2008, U.S. Appl. No. 11/617,981, filed Dec. 29, 2006.

Office Action dated Oct. 16, 2008, U.S. Appl. No. 11/617,981, filed Dec. 29, 2006.

Office Action dated Apr. 21, 2009 in U.S. Appl. No. 11/617,981.

Response to Office Action filed Jun. 15, 2009 in U.S. Appl. No. 11/617,981.

* cited by examiner

| Wordline | Upper/ Lower Page | All Bit Lines |
|---|---|---|
| WL3 | upper | Page 7 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |

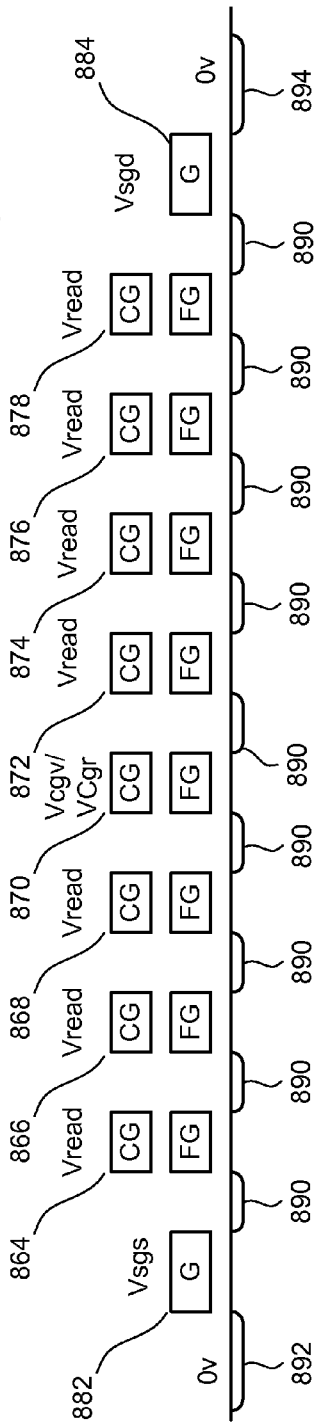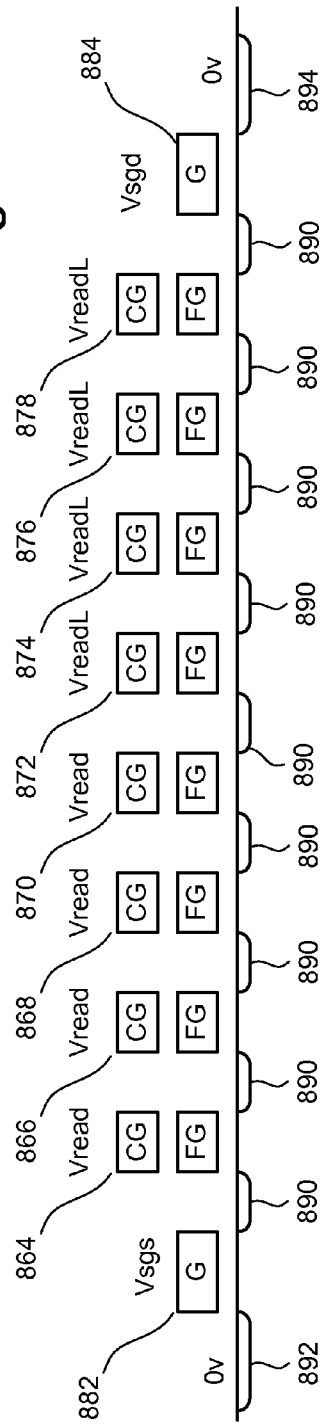

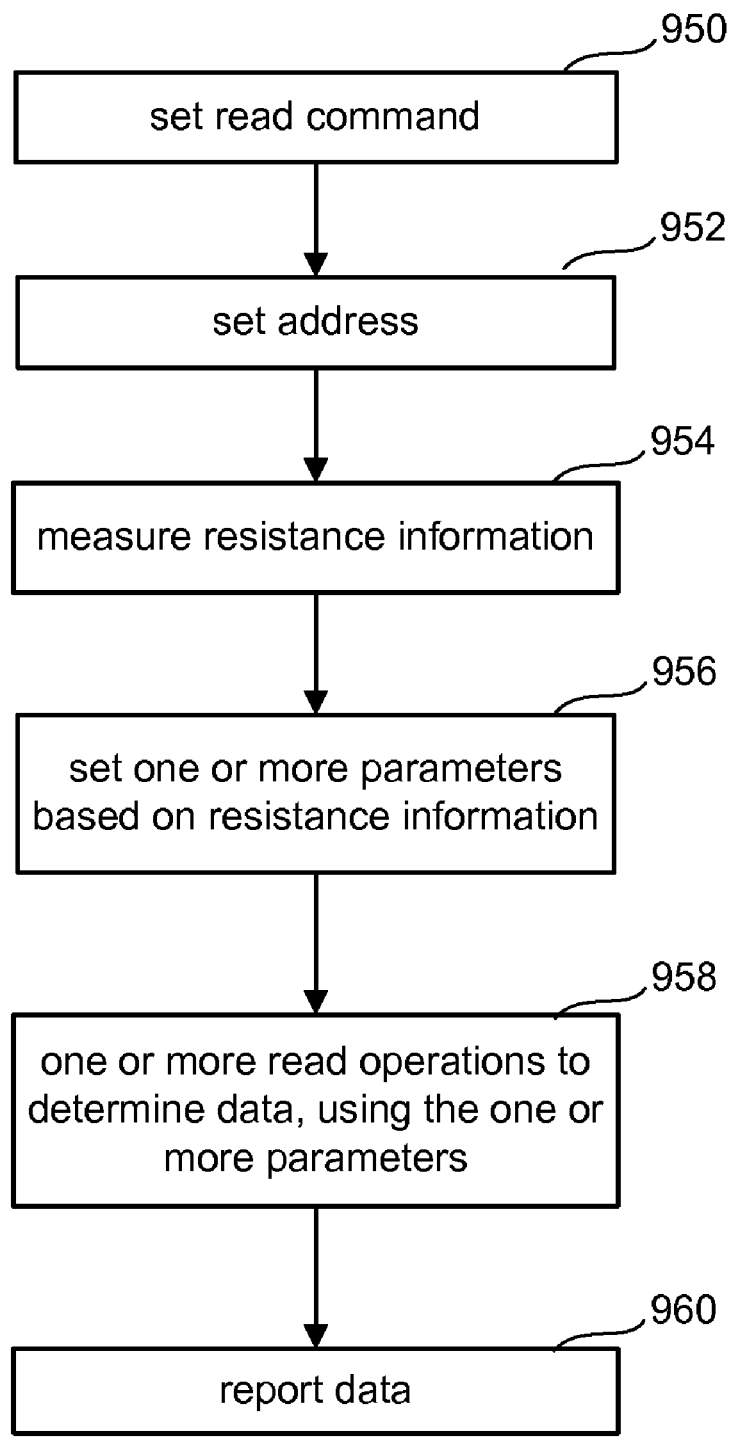

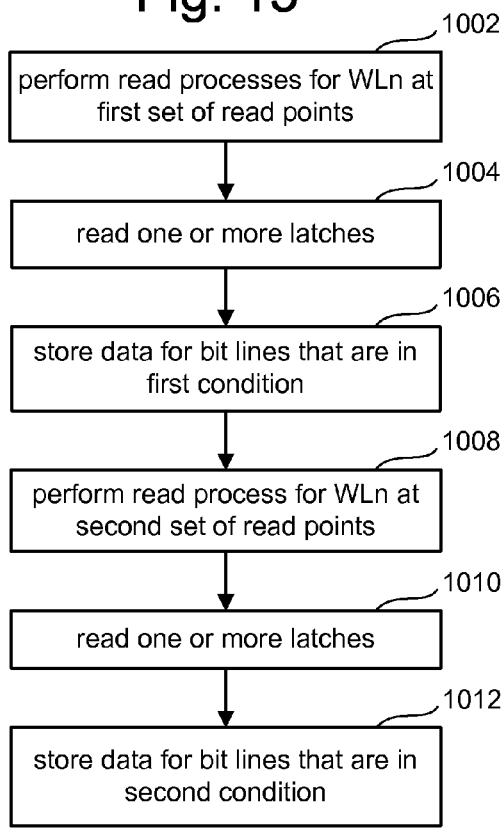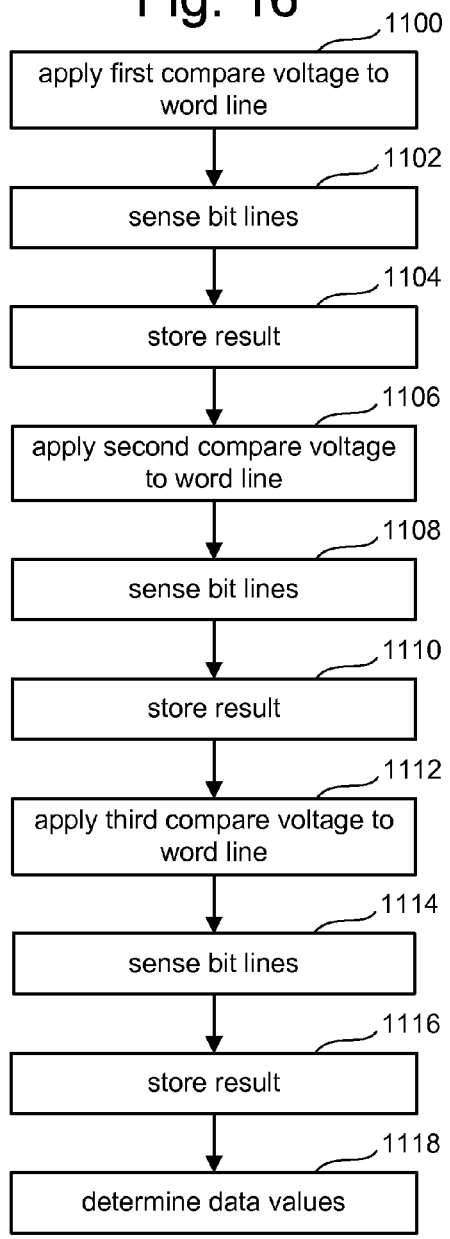

RESISTANCE SENSING AND COMPENSATION FOR NON-VOLATILE STORAGE

CROSS-REFERENCE TO RELATED APPLICATIONS

The following application is cross-referenced and incorporated by reference herein in its entirety: U.S. patent application No. 11/617,981, entitled "Non-Volatile Storage System With Resistance Sensing And Compensation," Inventors Nima Mokhlesi and Raul-Adrian Cernea, filed Dec. 29, 2006, incorporated herein by reference in its entirety.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determined whether the memory cell(s) being programmed have reached their target level. If a memory cell has reached its target level, programming stops for that memory cell. If a memory cell has not reached its target level, programming will continue for that memory cell.

One example of a flash memory system uses the NAND structure, which includes arranging multiple transistors in series between two select gates. The transistors in series and the select gates are referred to as a NAND string.

In a typical NAND flash memory device, memory cells are programmed in a certain order wherein the memory cells on the word line that is next to the source side select gate are programmed first. Subsequently, the memory cells on the adjacent word line are programmed, followed by the programming of memory cells on the next adjacent word line, and so on, until the memory cells on the last word line next to the drain side select gate are programmed.

As more memory cells in a NAND string are programmed, the conductivity of the channel areas under the unselected word lines will decrease because programmed memory cells have a higher threshold voltage than memory cells that are in the erased state. This increasing of channel resistance changes the IV characteristics of the memory cells. When a particular memory cell was being programmed (and verified), all the memory cells on the word lines higher (closer to the drain side select gate) than the selected word line were still in the erased state. Therefore, the channel area under those word lines was conducting very well, resulting in a relatively high cell current during the actual verify operation. However, after all memory cells of the NAND string have been programmed to their desired state, the conductivity of the channel area under those word lines usually decreases as most of the cells will be programmed to one of the programmed states (while a smaller number, on average 25%, will stay in the erased state). As a result, the IV characteristics change since less current will flow than compared to previous verify operations performed during programming. The lowered current causes an artificial shift of the threshold voltages for the memory cells, which can lead to errors when reading data. This effect is referred to as the back pattern effect.

SUMMARY OF THE INVENTION

Technology for reading non-volatile storage is proposed that accounts for the back pattern effect. When reading data from a non-volatile storage element that is part of a group of connected non-volatile storage elements, resistance information is measured for the group. One or more read parameters are set based on the measured resistance information. The read process is then performed using the one or more parameters.

One embodiment includes measuring resistance information for one or more groups of connected non-volatile storage elements and reading data from one or more non-volatile storage elements of each group using the resistance information.

One embodiment includes measuring resistance information for one or more NAND strings, separately choosing a parameter for each NAND string based on the resistance information, and performing one or more read operations for at least one non-volatile storage element for each NAND string using the chosen parameters. Each of the NAND strings includes a set of non-volatile storage elements.

One embodiment includes measuring resistance information for one or more groups of connected non-volatile storage elements. Each group of connected non-volatile storage elements includes a target non-volatile storage element and a neighbor non-volatile storage element that is next to the target non-volatile storage element. The process also includes determining condition information for the neighbor non-volatile storage element and performing one or more read operations for the target non-volatile storage element while providing compensation to the neighbor non-volatile storage element. The compensation is based on the condition information and the resistance information. The condition information is indicative of a condition of the neighbor non-volatile storage element.

One embodiment includes measuring resistance information for a group of connected non-volatile storage elements, determining condition data for the neighbor non-volatile storage element based on a data storage condition of the neighbor non-volatile storage element and adjusting the condition data if the resistance information indicates a first resistance condition. Subsequent to the adjusting of the condition data if the resistance information indicates a first resistance condition, one or more read operations are performed for the target non-volatile storage element. The read operations includes applying a read voltage to the target non-volatile storage element while applying a first voltage to the neighbor non-volatile storage element and a second voltage to other unselected non-volatile storage elements of the group. The first voltage is based on the condition data.

One embodiment includes applying a first voltage to a first subset of non-volatile storage elements on one or more NAND strings, applying a second voltage to a second subset of non-volatile storage elements on the one or more NAND strings, and sensing resistance information for the one or more NAND strings based on a current flowing in the NAND strings in response to applying the first voltage and the second voltage.

One example implementation comprises a plurality of non-volatile storage elements and one or more managing circuits in communication with the plurality of non-volatile storage elements for performing the processes discussed herein.

BRIEF DESCRIPTION OF THE DRAWINGS

FIG. 12 depicts a NAND string.
FIG. 13 depicts a flow chart describing one embodiment of a process for reading data.
FIG. 14 depicts a NAND string.
FIG. 15 depicts a flow chart describing one embodiment of a process for performing a plurality of read operations.
FIG. 16 depicts a flow chart describing one embodiment of a read process.

DETAILED DESCRIPTION

Figure 1:
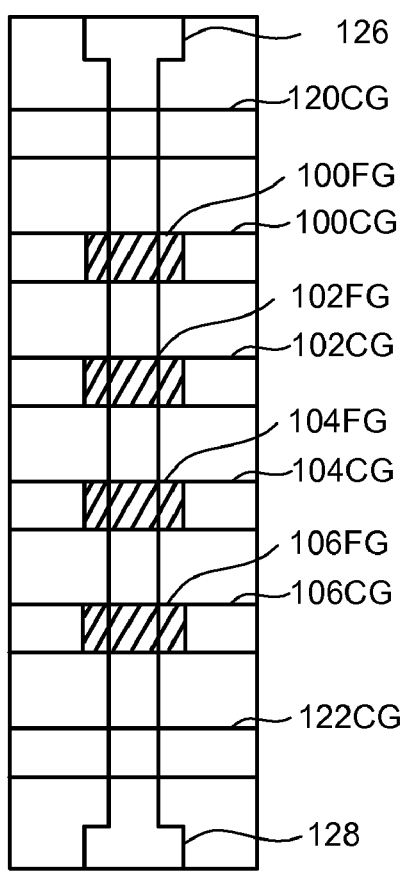
FIG. 1 is a top view of a NAND string.
Figure 2:
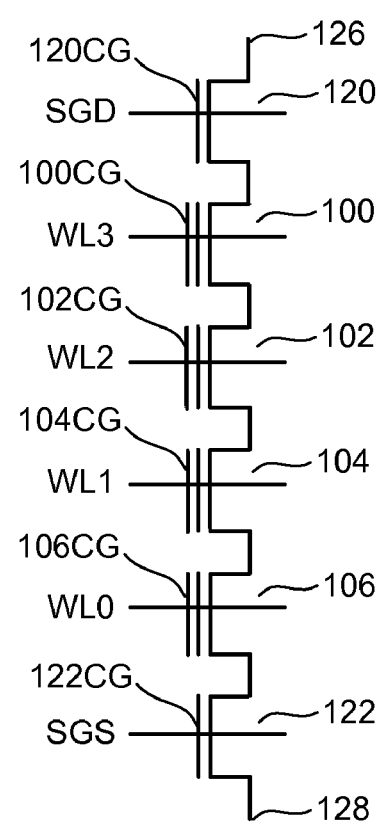
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01," and "00." If eight levels of information (or states) are stored (e.g. for three bits of data), there will be eight threshold voltage ranges assigned to the data values "000", "001", "010", "011" "100", "101", "110" and "111" The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
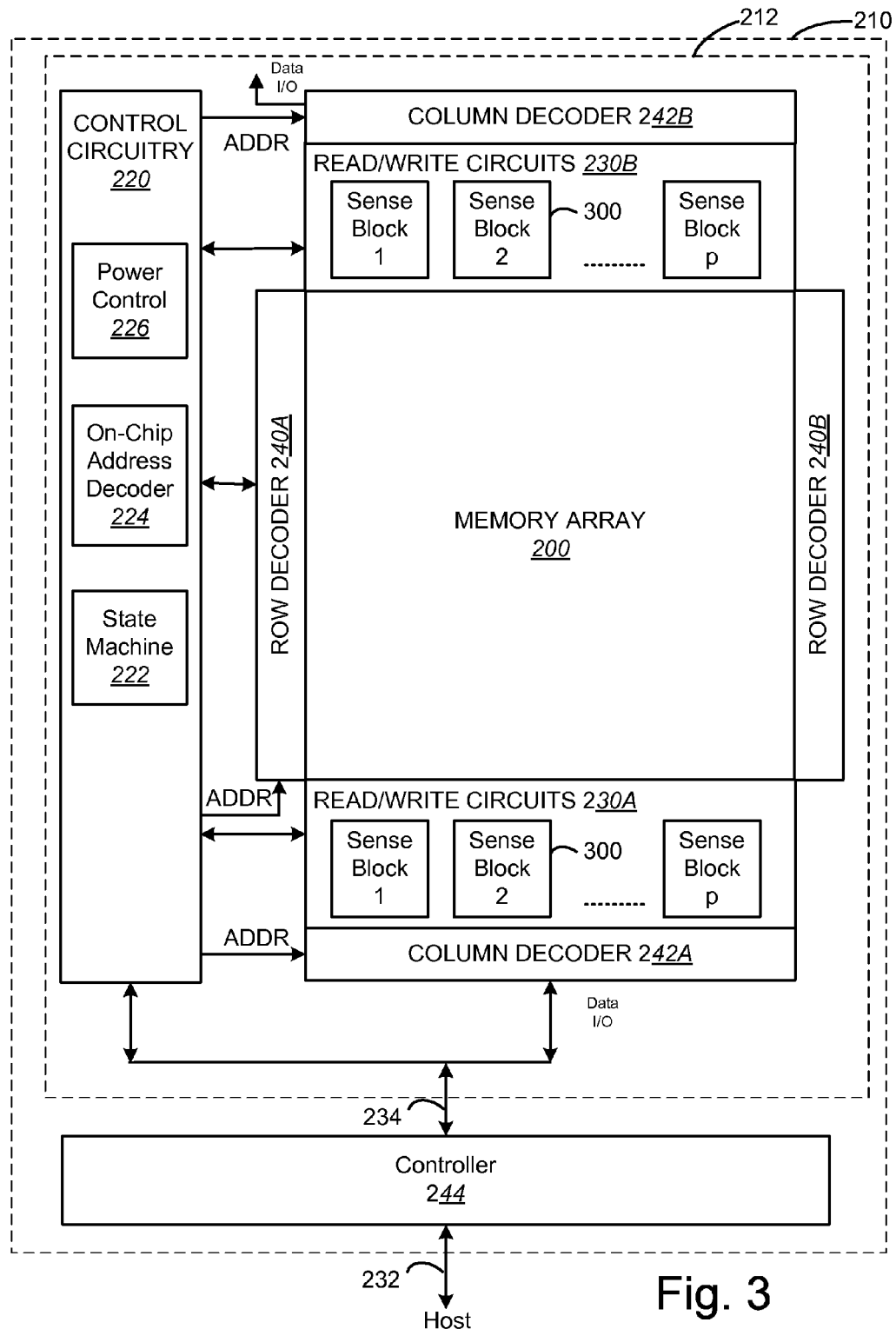
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 221, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
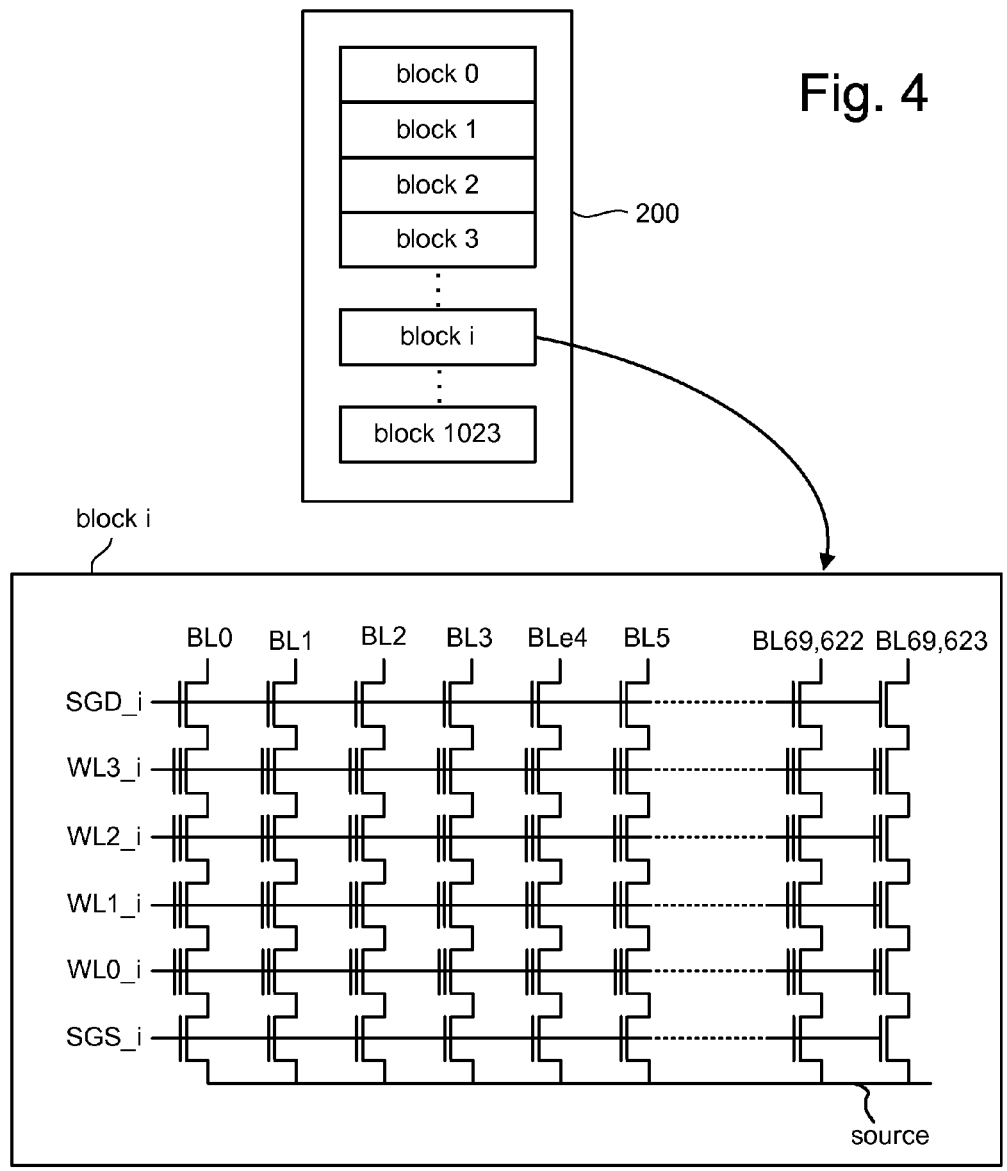
FIG. 4 is a block diagram depicting one embodiment of a memory array.

FIG. 4 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks can also be used.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Figure 5:
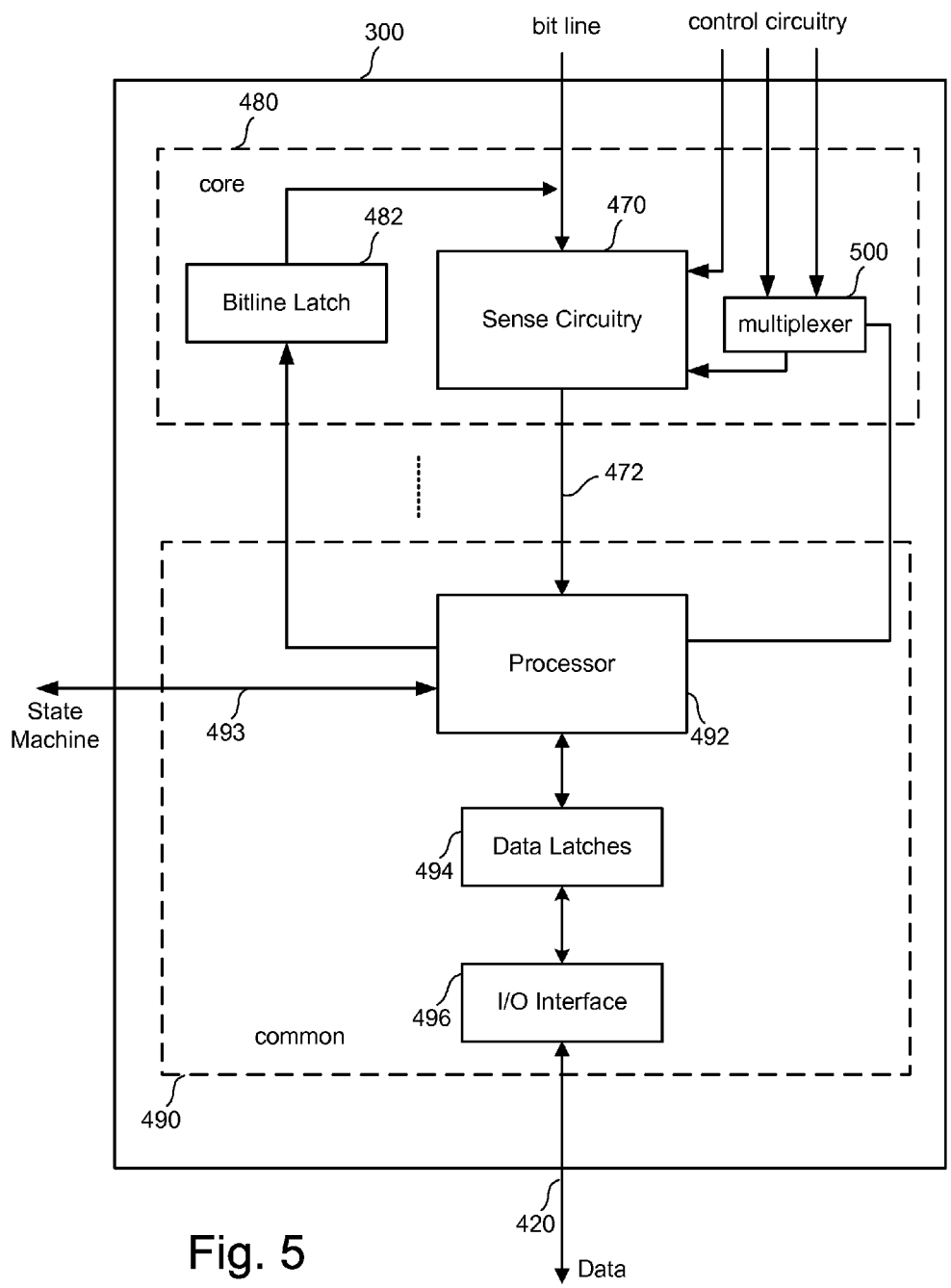
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. Since a sense module is associated with a bit line (and, thus, a NAND string), then there are three data latches (e.g., L1, L2 and L3) per NAND string. Thus, a particular memory cell and its neighbors on the same NAND string share a common set of three latches. In one embodiment, the latches are each one bit.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6:
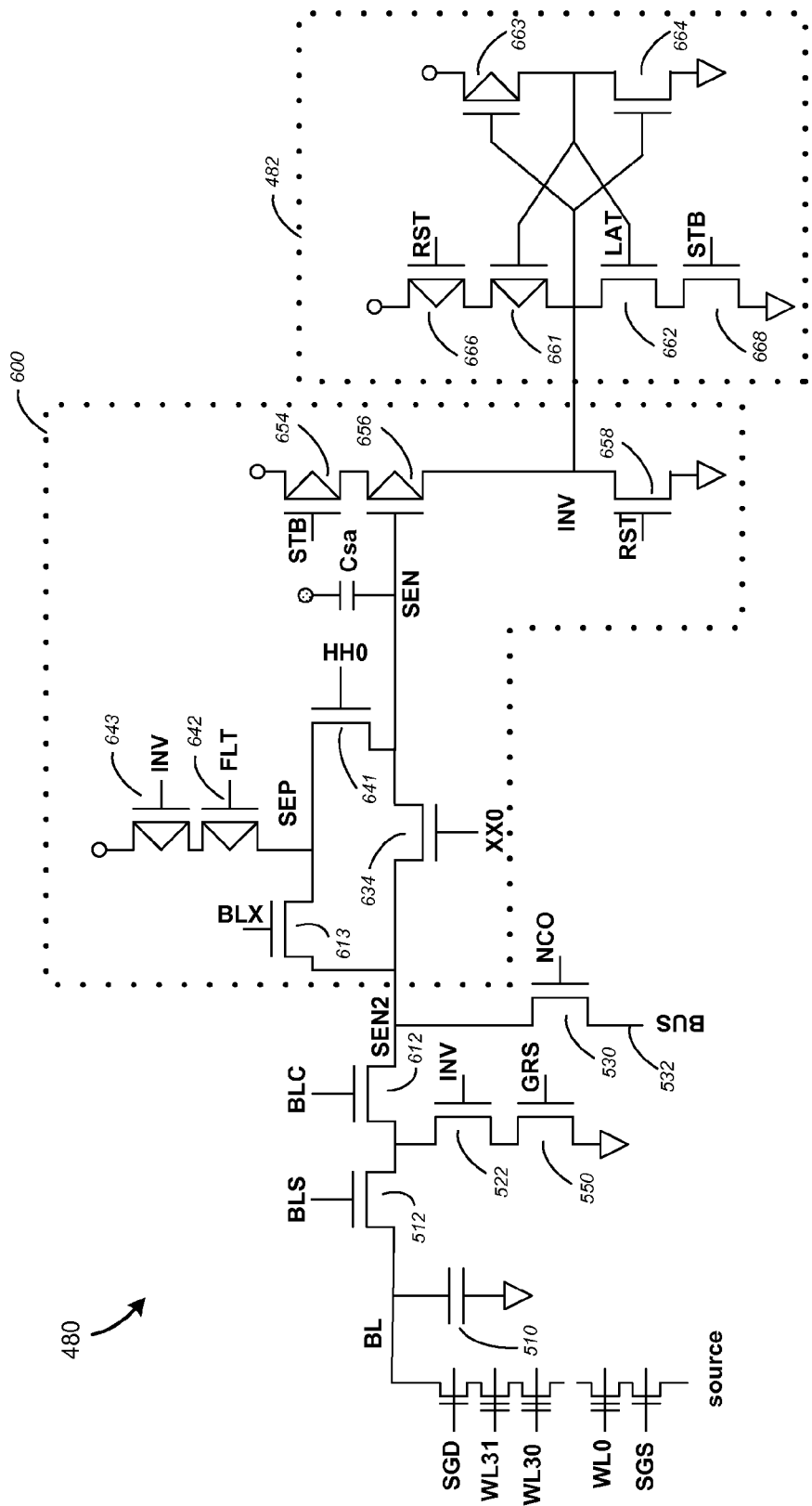
FIG. 6 depicts one embodiment of a sense module.

FIG. 6 illustrates an example of sense module 480; however, other implementations can also be used. Sense module 480 comprises bit line isolation transistor 512, bit line pull down circuit (transistors 522 and 550), bit line voltage clamp transistor 612, readout bus transfer gate 530, sense amplifier 600 and bit line latch 482. One side of bit line isolation transistor 512 is connected to the bit line BL and capacitor 510. The other side of bit line isolation transistor 512 is connected to bit line voltage clamp transistor 612 and bit line pull down transistor 522. The gate of bit line isolation transistor 512 receives a signal labeled as BLS. The gate of bit line voltage clamp transistor 612 receives a signal labeled as BLC. Bit line voltage clamp transistor 612 is connected to readout bus transfer gate 530 at node SEN2. Readout bus transfer gate 530 is connected to readout bus 532. Bit line voltage clamp transistor 512 connects to sense amplifier 600 at node SEN2. In the embodiment of FIG. 6, sense amplifier 600 includes transistors 612, 634, 641, 642, 643,654, 656 and 658, as well as capacitor Csa, Bit line latch 482 includes transistors 661, 662, 663, 664, 666 and 668.

In general, memory cells along a word line are operated on in parallel. Therefore, a corresponding number of sense modules are in operation in parallel. In one embodiment, state machine 222 and/or processor 492 provide control and timing signals to the sense modules operating in parallel. In some embodiments, data along a word line is divided into multiple pages and the data is read a page at a time, or multiple pages at a time.

Sense module 480 is connectable to the bit line (e.g., bit line BL) for a memory cell when the bit line isolation transistor 512 is enabled by signal BLS. Sense module 480 senses the conduction current of the memory cell by means of sense amplifier 600 and latches the read result as a digital voltage level at a sense node SEN2 and outputs it to readout bus 532 via gate 530.

The sense amplifier 600 comprises a second voltage clamp (transistors 613 and 634), a pre-charge circuit (transistors 641, 642 and 643), and a discriminator or compare circuit (transistors 654, 656 and 658; and capacitor Csa). In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN to decrease, effectively charging or increasing the voltage across capacitor Csa whose other terminal can be at Vdd. If the voltage on node SEN discharges to a predetermined level during a predetermined sensing period, then sense amplifier 600 reports that the memory cell turned on in response to the control gate voltage.

One feature of the sense module 480 is the incorporation of a constant voltage supply to the bit line during sensing. This is preferably implemented by the bit line voltage clamp transistor 612, which operates like a diode clamp with transistor 612 in series with the bit line BL. Its gate is biased to a constant voltage BLC equal to the desired bit line voltage VBL above its threshold voltage Vt. In this way, it isolates the bit line from the node SEN and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors.

Sense amplifier 600 senses the conduction current through the sense node SEN and determines whether the conduction current is above or below a predetermined value. The sense amplifier outputs the sensed result in a digital form as the signal SEN2 to readout bus 532.

The digital control signal INV, which can essentially be an inverted state of the signal at SEN2, is also output to control the pull down circuit. When the sensed conduction current is higher than the predetermined value, INV will be HIGH and SEN2 will be LOW. This result is reinforced by the pull down circuit. The pull down circuit includes an n-transistor 522 controlled by the control signal INV and another n-transistor 550 controlled by the control signal GRS. The GRS signal when LOW allows the bit line BL to be floated regardless of the state of the INV signal. During programming, the GRS signal goes HIGH to allow the bit line BL to be pulled to ground and controlled by INV. When the bit line BL is required to be floated, the GRS signal goes LOW. Note that other designs of sense modules, sense amplifiers and latches can also be used.

On one embodiment, read/write circuits 365 operate on a page of memory cells simultaneously. Each sense module 480 in the read/write circuits 365 is coupled to a corresponding cell via a bit line. In one embodiment, the conduction current flows from the sense module through the bit line into the drain of the memory cell and out from the source before going through a source line to ground. In an integrated circuit chip, the sources of the cells in a memory array are all tied together as multiple branches of the source line connected to some external ground pad (e.g., Vss pad) of the memory chip. Even when metal strapping is used to reduce the resistance of the source line, a finite resistance, R, remains between the source electrode of a memory cell and the ground pad. Typically, the ground loop resistance R is around 50 ohm.

Additional information about the read operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figures 7, 9:
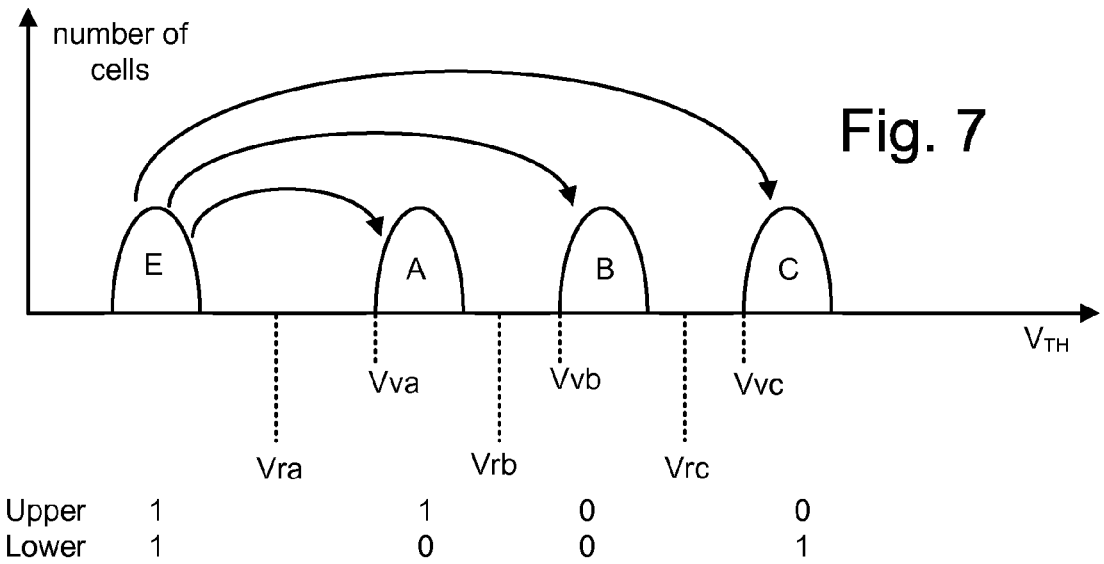
FIG. 7 depicts an example set of threshold voltage distributions and describes a process for programming non-volatile memory.
FIGS. 9 is a table depicting one example of an order of programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 7 illustrates example threshold voltage distributions (or data states) for the memory cell array when each memory cell stores two bits of data. Other embodiment, however, may use more or less than two bits of data per memory cell (e.g., such as three bits of data per memory cell). FIG. 7 shows a first threshold voltage distribution E for erased memory cells. Three threshold voltage distributions A, B and C for programmed memory cells are also depicted. In one embodiment, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used.

In one embodiment, the two bits of data for each state are in different pages. With reference to state E of FIG. 7, both pages store a "1." With respect to state A, the upper page stores bit 1 and the lower page stores bit 0. With reference to state B, both pages store a "0." With reference to state C, the upper page stores bit 0 and the lower page stores bit 1.

In another embodiment, the two bits of data for each state are in the same page. Although FIG. 7 shows four states, the present invention can also be used with other multi-state structures including those that include more or less than four states. For example, a memory cell that stores three bits of data may use eight data states.

FIG. 7 also shows three read reference voltages, Vra, Vrb and Vrc, for reading data from memory cells. By testing whether the threshold voltage of a given memory cell is above or below Vra, Vrb and Vrc, the system can determine what state the memory cell is in. Example values of Vra, Vrb and Vrc are 0.0V, 1.25V, and 2.5V respectively. Other examples include Vra=00 v, Vrb=1.25 v and Vrc=2.65 v; or Vra=0.0 v, Vrb=1.35 v and Vrc=2.60 v.

FIG. 7 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc. Example values of Vva, Vvb and Vvc are 0.5V, 1.8V, and 3.2V respectively. Other examples include Vva=0.40 v, Vvb=1.80 v and Vvc=3.35 v; or Vva=0.5 v, Vvb=1.9 v and Vvc =3.3 v.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C. Full sequence programming is graphically depicted by the three curved arrows of FIG. 7.

Figure 8A:
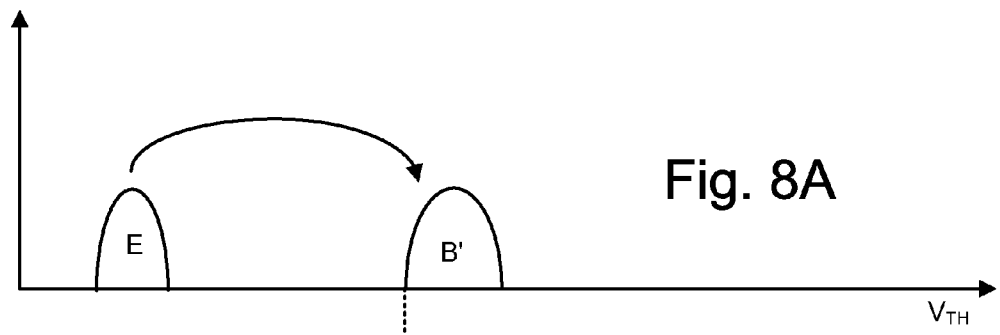
FIGS. 8A-C show various threshold voltage distributions and describe a process for programming non-volatile memory.
Figure 8B:
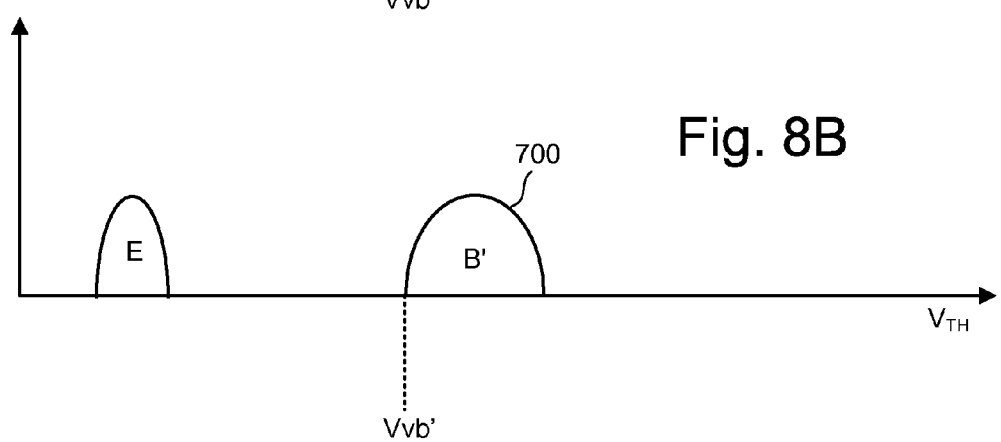
Figure 8C:
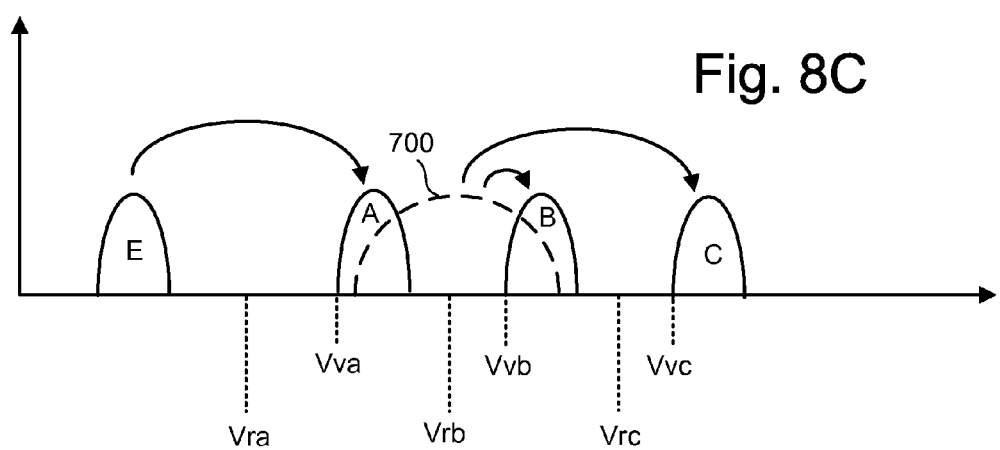

FIGS. 8A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each memory cell stores data in two pages. For reference purposes these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0.

The programming process of FIGS. 8A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (connected to WLn+1) in the NAND string will then be programmed with respect to its lower page. For example, after the lower page for a memory cell connected to WL0 is programmed, the lower page for a memory cell (the neighbor memory cell) on the same NAND string but connected to WL1 would be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted by intermediate threshold voltage distribution 700 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 700 and the upper page data is to remain at 1, then the memory cell will be programmed to final state B. If the memory cell is in intermediate threshold voltage distribution 700 and the upper page data is to become data 0, then the threshold voltage of the memory cell will be raised so that the memory cell is in state C. The process depicted by FIGS. 8A-C reduces the effect of coupling between floating gates because only the upper page programming of neighbor memory cells will have an effect on the apparent threshold voltage of a given memory cell.

FIG. 9 is a table that describes one embodiment of the order for programming memory cells utilizing the programming method of FIGS. 8A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

In one embodiment, a system can be set up to perform full sequence writing if enough data is being written to fill up a word line. If not enough data is being written, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Pub. No. 2006/0126390, filed on Dec. 14, 2004, inventors Sergy Anatolievich Gorobets and Yan Li, incorporated herein by reference in its entirety.

Although FIGS. 7-9 depict the use of four data states to store two bits of data per memory cell, other embodiments could use a different number of data states to store a different (or the same) number of bits of data per memory cell. In one example, eight data states are used to store three bits of data.

Figure 10:
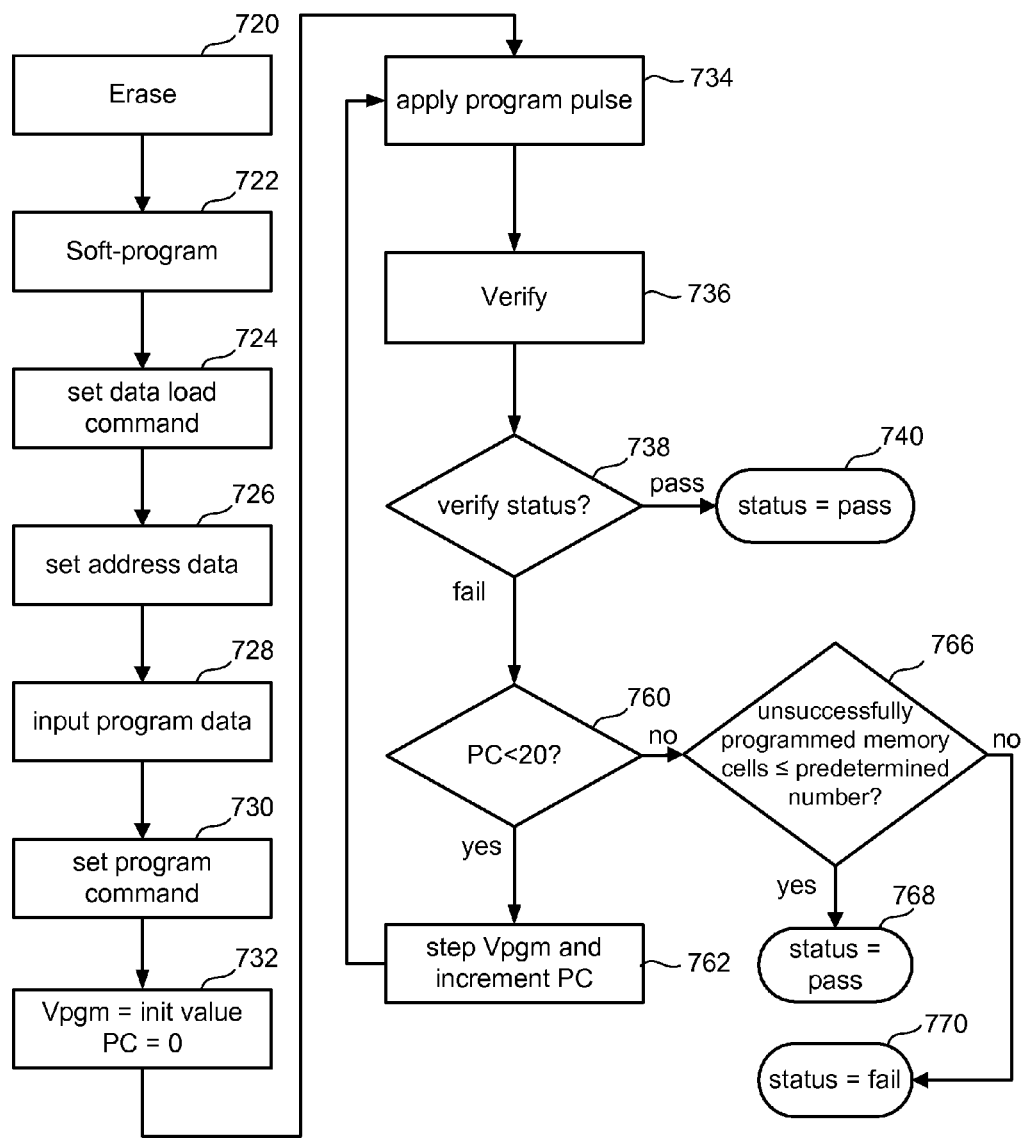
FIG. 10 depicts a flow chart describing one embodiment of a process for programming non-volatile memory.

FIG. 10 is a flow chart describing a programming process for programming memory cells connected to a selected word line. Thus, the process of FIG. 10 is used to implement the full sequence programming of FIG. 7, or one pass (either the first pass or the second pass) of the two pass programming technique of FIGS. 8A-C. The process of FIG. 10 can also be performed as one pass of a three pass programming technique for three pages of data (e.g., three bits of data per memory cell), or as one pass of another multi-pass programming technique. Many different programming techniques can be used with the present invention. In one embodiment, the process of FIG. 10 is performed by and/or at the direction of control circuitry 220 (state machine 222 provides the control and power control 226 provides the appropriate signals) and/or at the direction of controller 244. Because a programming process may include programming multiple pages, the programming process may include performing the process of FIG. 9 multiple times.

Note that in some embodiments (but not all), memory cells are programmed from the source side to the drain side. For example, looking at FIG. 4, word line WL0 is programmed first, followed by programming WL1, followed by programming WL2, etc.

In one implementation of the process of FIG. 10, memory cells are erased (in blocks or other units) prior to programming (step 720). Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and source are also raised to a significant fraction of the erase voltage. A strong electric field is thus applied to the tunnel oxide layers of selected memory cells and the data of the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, a block, or another unit of cells. After the block of memory cells is erased, the various memory cells can be programmed as described herein. Note that the erasing that is performed in step 720 would not need to be performed before each word line of a block is programmed. Rather, the block can be erased and then each word line can be programmed without subsequent repeat erasing.

In step 722, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells to a tighter threshold voltage distribution. Note that the erasing and soft programming may be performed once for a block prior to each page being programmed.

In step 724, a "data load" command is issued by controller 244 and input to state machine 222. In step 726, address data designating the page address is provided to the decoder circuitry. In step 728, a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations.

In step 730, a "program" command is received from controller 244 and provided to state machine 222.

Triggered by the "program" command, the data latched in step 728 will be programmed into the selected memory cells controlled by state machine 222 using a set of pulses applied to the appropriate word line. In step 732, Vpgm, the programming voltage signal (e.g., the set of pulses) is initialized to the starting magnitude (e.g., ~12V or another suitable level) and a program counter PC maintained by state machine 222 is initialized at 0. In step 734, a pulse of the program signal Vpgm is applied to the selected word line.

In step 736, the data states of the selected memory cells are verified using the appropriate set of target levels (e.g., Vva, Vvb, Vvc). If it is detected that the threshold voltage of a selected memory cell has reached the appropriate target level, then the memory cell is locked out of future programming for the remainder of the process of FIG. 10 by raising its bit line voltage. If all memory cells being programmed have reached their target data states (step 738), the programming process is complete and successful because all selected memory cells were programmed and verified to their target states. A status of "PASS" is reported in step 740. Note that in some implementations of step 738, it is checked whether at least a predetermined number of memory cells have been verified to have reached their target states. This predetermined number can be less than the number of all memory cells, thereby allowing the programming process to stop before all memory cells have reached their appropriate verify levels. The memory cells that are not successfully programmed can be corrected using error correction during the read process.

If, in step 738, it is determined that not all of the memory cells have reached their target states, then the programming process continues. In step 750, the program counter PC is checked against a program limit value. One example of a program limit value is 20; however, other values can be used in various implementations. If the program counter PC is not less than the program limit value, then it is determined in step 7666 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 768. In many cases, the memory cells that are not successfully programmed can be corrected using error correction during the read process. If, however, the number of unsuccessfully programmed memory cells is greater than the predetermined number, the program process is flagged as failed and a status of FAIL is reported In step 770. If the program counter PC is less than the program limit value, then the magnitude of the Vpgm pulse is increased by the step size (e.g., 0.2-0.4 volt step size) and the program counter PC is incremented in step 762. After step 762, the process loops back to step 734 to apply the next Vpgm pulse.

Figure 11:
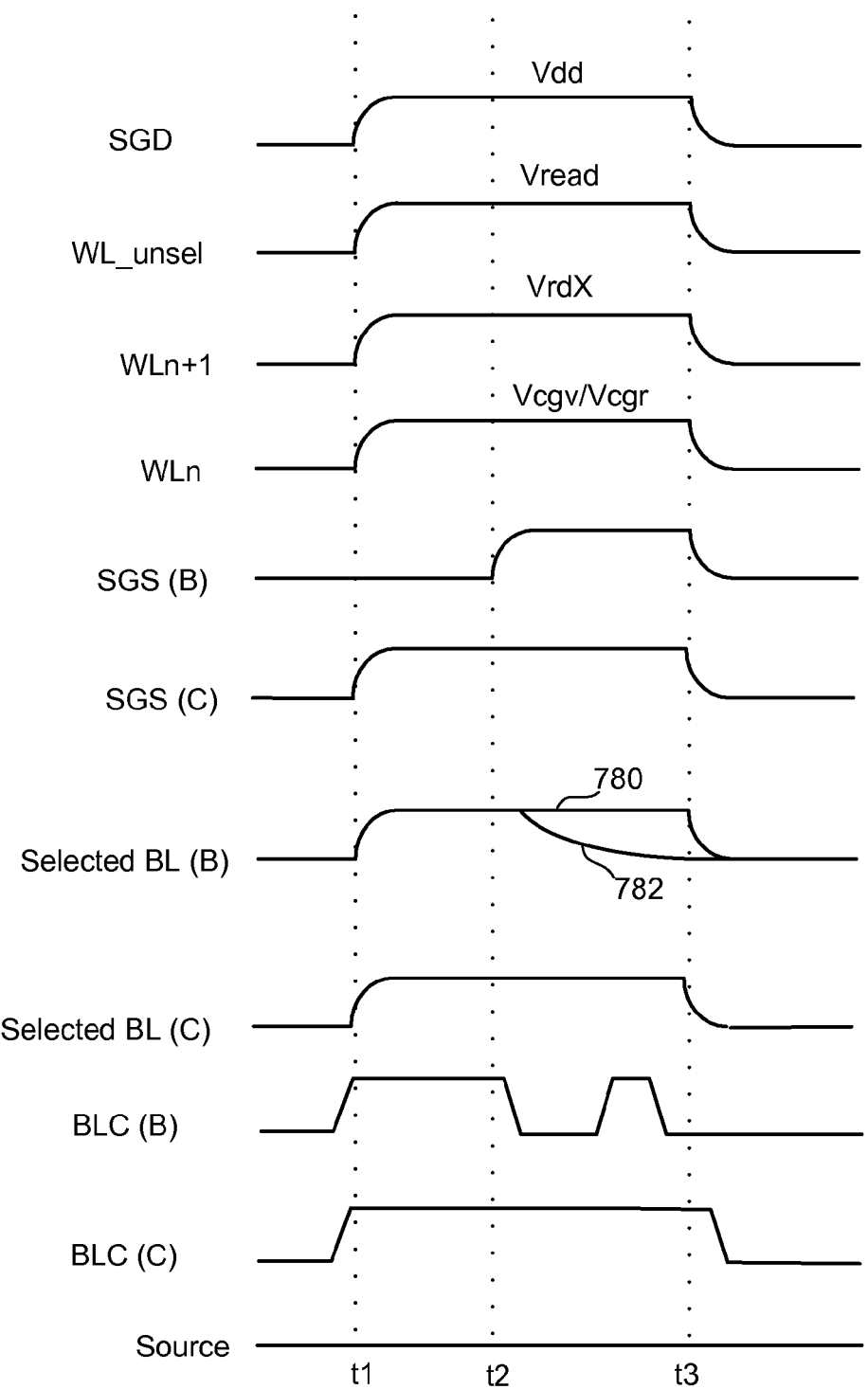
FIG. 11 depicts a timing diagram describing one embodiment of a read operation for non-volatile memory.

FIG. 11 is a timing diagram depicting the behavior of various signals during a verify or read operation. For example, if the memory cells are binary memory cells, the operation of FIG. 11 may be performed during an iteration of step 736. If the memory cells are multi-state memory cells with four states (e.g., E, A, B, and C), the operation of FIG. 11 may be performed three times during an iteration of step 736 or three times during a read process.

In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not. FIG. 11 explains both examples.

FIG. 11 shows signals SGD, WL_unsel, WLn+1, WLn, SGS, Selected BL, BLC, and Source starting at Vss (approximately 0 volts). SGD represents the gate of the drain side select gate. SGS is the gate of the source side select gate. WLn is the word line selected for reading/verification. WLn+1 is the unselected word line that is the drain side neighboring word line to WLn. For example, WL3 is the drain side neighbor of WL2. WL_unsel represents the unselected word lines other than WLn+1. Selected BL is the bit line selected for reading/verification. Source is the source line for the memory cells. BLC is discussed above with respect to FIG. 6. Note that FIG. 11 depicts two versions of SGS, Selected BL and BLC. One set of these signals SGS (B), Selected BL (B) and BLC (B) depict a read/verify operation for an array of memory cells that measure the conduction current of a memory cell by determining whether the bit line has been discharged. Another set of these signals SGS (C), Selected BL (C) and BLC (C) depict a read/verify operation for an array of memory cells that measure the conduction current of a memory cell by the rate it charges a dedicated capacitor in the sense amplifier.

First, the behavior of the sensing circuits and the array of memory cells that are involved in measuring the conduction current of a memory cell by determining whether the bit line has discharged will be discussed with respect to SGS (B), Selected BL (B), and BLC (B). At time t1 of FIG. 11, SGD is raised to Vdd (e.g., approximately 3.5 volts), unselected word lines WL_unsel are raised to Vread (e.g., approximately 5.5-5.75 volts), unselected drain side neighboring word line WLn+1 is raised to VrdX (which can be approximately 5.5-5.75 volts or another value, as discussed below), the selected word line WLn is raised to a verify level Vcgv (e.g., Vva, Vvb, or Vvc of FIG. 7) for a verify operation or a read compare level Vcgr (e.g., Vra, Vrb, or Vrc of FIG. 7) for a read operation, and BLC (B) is raised to a pre-charging voltage to pre-charge the selected bit line Selected BL(B) (e.g., to approximately 0.7 volts). The voltages Vread and VrdX act as pass (or overdrive) voltages because they cause the unselected memory cells to turn on and act as pass gates. At time t2, BLC (B) is lowered to Vss so the NAND string can control the bit line. Also at time t2, the source side select gate is turned on by raising SGS (B) to Vdd. This provides a path to dissipate the charge on the bit line. If the threshold voltage of the memory cell selected for reading is greater than Vcgr or Vcgv, then the selected memory cell will not turn on and the bit line will not discharge, as depicted by signal line 780. If the threshold voltage in the memory cell selected for reading is below Vcgr or below Vcgv, then the selected memory cell will turn on (conduct) and the bit line voltage will dissipate, as depicted by curve 782. At some point (the end of the sensing period) after time t2 and prior to time t3 (as determined by the particular implementation), the sense amplifier will determine whether the bit line has dissipated a sufficient amount. In between t2 and t3, BLC (B) is raised to let the sense amplifier measure the evaluated BL voltage and then lowered, as depicted in FIG. 10. At time t3, the depicted signals will be lowered to Vss (or another value for standby or recovery). Note that in other embodiments, the timing of some of the signals can be changed (e.g. shift the signal applied to the neighbor).

Next, the behavior of the sensing circuits and the array of memory cells that measure the conduction current of a memory cell by the rate it charges a dedicated capacitor in the sense amplifier will be discussed with respect to SGS (C), Selected BL (C) and BLC (C). At time t1 of FIG. 11, SGD is raised to Vdd (e.g., approximately 3.5 volts), the unselected word lines WL_unsel are raised to Vread, the unselected drain side neighboring word line WLn+1 is raised to VrdX, the selected word line WLn is raised to Vcgv (e.g., Vva, Vvb, or Vvc of FIG. 7) for a verify operation or Vcgr (e.g., Vra, Vrb, or Vrc of FIG. 7) for a read operation, and BLC (C) is raised. In this case, the sense amplifier holds the bit line voltage constant, so the sense amplifier measures the current flowing with the bit line "clamped" to that voltage. Therefore, BLC (C) rises at t1 and does not change from t1 to t3. At some point (the end of the sensing period) after time t1 and prior to time t3 (as determined by the particular implementation), the sense amplifier will determine whether the capacitor in the sense amplifier has charged a sufficient amount. At time t3, the depicted signals will be lowered to Vss (or another value for standby or recovery). Note that in other embodiments, the timing of some of the signals can be changed.

FIG. 12 depicts a NAND string and a set of voltages applied to the NAND string during a typical read or verify operation depicted in FIG. 11. The NAND string of FIG. 12 includes eight memory cells 864, 866, 868, 870, 872, 874, 876 and 878. Each of those eight memory cells includes a floating gate (FG) and a control gate (CG). Between each of the floating gates are source/drain regions 890. In some implementations, there is a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. The source/drain regions 890 are N+ diffusion regions that are formed in the P-well. At one end of the NAND string is a drain side select gate 884. The drain select gate 884 connects the NAND string to the corresponding bit line via bit line contact 894. At another end of the NAND string is a source select gate 882. Source select gate 882 connects the NAND string to common source line 892. The selected memory cell 870 receives Vcgr or Vcgv at its control gate (via the selected word line WLn). The unselected memory cells 864, 866, 868, 872, 874, 876 and 878 are all depicted as receiving Vread at their control gates via the unselected word lines. Note that FIG. 12 assumes that VrdX=Vread. In other embodiment, as described below, VrdX≠Vread.

FIG. 13 is a flow chart describing one embodiment of a process performed in response to receiving a request to read data. In step 950, a read command is issued by controller 244 and input to state machine 222. In step 952, address data designating the page address is provided to the decoder circuitry. Based on the page address, one word line is designated/addressed as the selected word line WLn. The subsequent read process will read data from memory cells connected to WLn. In step 954, resistance information is measured for each NAND string. In one embodiment, an analog resistance value is determined for each NAND string. In another embodiment, each NAND string is tested to determine if its resistance is above or below a certain level. In another embodiment, each NAND string is tested to determine if its resistance is above or below a set of levels so that the NAND string can be classified into one of many categories of resistance values. Other tests for resistance information can also be performed.

One example of a process for measuring resistance information (step 954 of FIG. 13) is to perform a modified version of the process of FIG. 11, with the modifications that include applying Vread to the control gate of the selected memory cell (e.g., by applying Vread to WLn), applying Vread to the unselected memory cells located on the NAND string between the selected memory cell and the source side select gate, and applying VreadL (an overdrive voltage that is lower than Vread) to the unselected memory cells located on the NAND string between the selected memory cell and the drain side select gate. This process for measuring resistance information for a NAND string is graphically depicted in FIG. 14, which shows the NAND string of FIG. 12 having memory cells 864, 866, 868, 870, 872, 874, 876 and 878.

It should be noted that, in one embodiment, the bit line voltage used for the assessment of the upper NAND string resistance should be a lower value than that used during normal read operations. This is useful in keeping the total current consumed by all the cells that are being read in simultaneously below a required limit, as all bit lines will be ON in the resistance reading operation. Another reason for lowering the bit line voltage during resistance sensing is to be able to place the cut-off criteria between those NAND strings that are to be classified as being in high resistance state and those that are to be classified as being in a low resistance state at the nominal trip point of sensing. In other words, by lowering the bit line voltage, high resistance NAND strings will have currents below 100 nA and low resistance NAND strings will have currents above 100 nA with the threshold trip point set at 100 nA, where 100 na is also the trip point current for distinguishing between ON and OFF memory cells during a regular read operation.

In another embodiment, instead of lowering the bit line voltage, the same bit line voltage can be used with a shorter integration time for resistance sensing purposes. The integration time is the time period used for sensing the increase or decrease in voltage (or current) of the bit line during a read or verify process At time t2 of the process of FIG. 11, memory cells 864, 866, 868, and 870 receive Vread at their control gate while memory cells 872, 874, 876 and 878 receive VreadL at their control gate. If the voltage on node SEN (see FIG. 6) discharges to a predetermined level (sense amplifier trip point) during a predetermined sensing period, then sense amplifier 600 reports that the NAND string is in a low resistance state. If the voltage on node SEN does not discharge to the sense amplifier trip point during the predetermined sensing period, then sense amplifier 600 reports that the NAND string is in a high resistance state. Other embodiments may use a different arrangement to make the measurement.

In one embodiment, VreadL is approximately 4.5 volts. However, the exact value of VreadL should be determined for each design. VreadL should be a high enough voltage so that the memory cells with the highest threshold voltages turn on, but low enough to be able to concentrate the measurement of whether the sense amplifier senses the trip point based on the differences of resistance due to the memory cells between the selected memory cell and the drain side select gate. VreadL also has to be calibrated to the sense amplifier trip point so that high and low resistance NAND strings can be distinguished. This example embodiment of step 954 determines on a NAND string by NAND string basis whether the NAND string is in a high resistance state or low resistance state based on whether the upper NAND string (memory cells located on the NAND string between the selected memory cell and the drain side select gate) are collectively in a high resistance state or low resistance state.

Although the above example implementation classifies each NAND string as either high or low, extra latches and several iterations of the process of FIG. 11 would allow more than two classifications.

In one embodiment, step 954 includes classifying each NAND string into two or more categories. For example, a NAND string may be classified as a high resistance NAND string or a low resistance NAND string. In other embodiments, more than two categories will be used. The result of the categorization is stored in a latch for each NAND string. In some embodiments, the measuring of resistance and categorization is performed together.

In step 956, one or more parameters used during the read process are individually set for each NAND string based on the corresponding measured resistance information for each NAND string. For example, one parameter value may be used if the NAND string was categorized as being in a high resistance state and another parameter value can be used if the NAND string was categorized as being in a low resistance state. Many different parameters can be set in step 956. Some examples include bit line voltage, word line (control gate) voltage (note that in some embodiments WL voltage is varied for high resitance and low resitance NAND strings sequentially rather than simultaneously as WL voltage does not allow bit line by bit line control), and parameters for the sense amplifier (e.g., sensing time and sense reference values).

In step 958, one or more read operations (FIG. 11) are performed using the parameters set in step 956. The number of read operations performed depends on the read request, the amount of data being read and the number of bits stored in a memory cell. For example, to read full sequence data for memory cells storing two bits of data per memory cell, three read operations (e.g., at Vra, Vrb and Vrc) are typically needed to determined the data stored by the memory cells. In step 960, the data read is reported. Various embodiments of reporting the data includes transmitting the data from the latches to the state machine, transmitting the data to the controller, transmitting the data to the host, storing the data in an output file, providing the data to a requesting entity, etc.

Looking back at FIG. 5, a multiplexer 500 is depicted in communication with processor 492, sense circuitry 470 and control circuitry 220. Multiplexer 500 can receive multiple input values of a parameter from control circuitry 220 and choose between the values based on the data stored in the appropriate latch that indicates whether the NAND string is in a high resistance or low resistance condition. For example, multiplexer 500 can choose between two voltages for BLC (see FIG. 6) to change the bit line voltage based on the measure resistance for a NAND string. If the NAND string is in a high resistance condition than a first value is chosen for BLC and if the NAND string is in a low resistance condition than a second value is chosen for BLC.

Alternatively, multiplexer 500 can choose between two signals for STB (see FIG. 6) to change the sense time based on whether the NAND string is in a high resistance condition or low resistance condition. Processor 492 reads the latch storing the results of the resistance measurement and appropriately instruct multiplexer 500 to choose the proper input signal. The chosen input signal is communicated to sense circuitry 470. For example, if the NAND string is in a high resistance condition than a first signal is chosen for STB resulting in a first sensing time period and if the NAND string is in a low resistance condition than a second signal is chosen for STB resulting in a second sensing time period. In one embodiment, the first sensing time period is greater than the second sensing time period.

In another embodiment, control circuitry 220 is in direct communication with sense circuitry 470, can access the latch storing the results of the resistance measurement, and will send the appropriate signal to sense circuitry 470 from a choice of two or more signals based on the data in the latch.

In another embodiment, a different sense amplifier can be used that receives a current or voltage signal that is used as a reference (e.g., trip point—see discussion above) to test NAND string current as part of the process of FIG. 11. In this case, a multiplexer at the direction of processor 492 can choose between the two reference signals based on latch data which indicates the results of the resistance measurement. The changing of bit line voltages, reference values, sensing times and other sense amplifier parameters can be used when reading data that was programmed according to the programming schemes described above, as well as other programming schemes known in the art.

Another parameter that can be varied based on NAND string resistance is control gate (or word line) voltage. FIG. 15 is a flow chart describing one embodiment of a process for varying the control gate (or word line) voltage based on measure NAND string resistance. The process of FIG. 15 can be performed as part of steps 956 and 958 of FIG. 13.

In step 1002 of FIG. 15, a read process is performed for the selected word line using a first set of word line (control gate) voltages as read points. One embodiment of step 1002 includes performing the process of FIG. 16.

FIG. 16 is a flow chart describing a read process for reading data for a selected word line. This read process determines the data state (of the possible data states) for the memory cells connected to that selected word line. In step 1100 of FIG. 16, a first compare voltage (e.g., Vra) is applied to the selected word line WLn. In step 1102, the bit lines associated with the page are sensed to determine whether the addressed memory cells turn on or do not turn on based on the application of the first compare voltage to their control gates. Bit lines that conduct indicate that the memory cells turned on; therefore, the threshold voltages of those memory cells are below the first compare voltage. For example, if the first compare voltage is Vra and the memory cell conducts, then the memory cell is in state E. In step 1104, the results of the sensing of the bit lines is stored in the appropriate latches for those bit lines. Steps 1100-1104 perform the process described in FIG. 11, with Vcgr set at the first compare voltage.

In step 1106, a second compare voltage (e.g., Vrb) is applied to the selected word line WLn. In step 1108, the bit lines associated with the page are sensed to determine whether the addressed memory cells turn on or do not turn on based on the application of the first compare voltage to their control gates. Bit lines that conduct indicate that the memory cells were turned on; therefore, the threshold voltages of those memory cells are below the second compare voltage. In step 1110 the result of the sensing for the bit lines is stored in the appropriate latches for those bit lines. Steps 1106-1110 perform the process described in FIG. 11, with Vcgr set at the second compare voltage.

In step 1112, a third compare voltage (e.g., Vrc) is applied to the selected word line WLn. In step 1114, the bit lines associated with the page are sensed to determine whether the addressed memory cells turn on or do not turn on based on the application of the first compare voltage to their control gates. Bit lines that conduct indicate that the memory cells were turned on; therefore, the threshold voltages of those memory cells are below the second compare voltage. In step 1116 the result of the sensing for the bit lines is stored in the appropriate latches for those bit lines. Steps 1112-1116 perform the process described in FIG. 11, with Vcgr set at the third compare voltage.

In step 1118, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 492 at the end of the process. In another embodiment, processor 492 determines the data values on the fly, such that as each sensing operation is performed the data analysis is updated. In step 118, processor 492 will store the determined data values in the appropriate latches for each bit line. In other embodiments, sensing the various levels (Vra, Vrb, and Vrc) may occur in different orders.

Note that the process of FIG. 16 can be used to read data from a set of memory cells connected to a word line, independent of the process of FIG. 15. That is, if the control gate voltage is not going to be varies based on NAND string resistance, then the read process (in one embodiment) may comprise performing the process of FIG. 16. If the sense amplifier parameters are to be varied (e.g., sense time, trip point, bit line voltage), the process of FIG. 16 can be used to read the appropriate data based on the chosen sense amplifier parameters.

Looking back at FIG. 15, after performing step 1002 the latches 494 that store the results from measuring the resistance information (see step 954 of FIG. 13) are read to see how the NAND strings have been classified. If a particular latch stores data indicating that its corresponding NAND string is in a low resistance state, then the data from step 1002 is stored in latches 494 (step 1006) as the final read data for the corresponding NAND string as a result of the process of FIG. 15.

In one embodiment, each NAND string (or bit line) has three 1-bit data latches in the set of latches 494. These three latches will be referred to as L1, L2 and L3. In one example implementation, the results of step 954 are stored in L1, such that L1=0 for an upper NAND string in a low resistance condition and L1=1 for an upper NAND string in a high resistance condition. In step 1006, for NAND strings having L1=0, the one or two bits of data read in step 1002 are stored in L1 and L2, with L3 being set to 1. Setting L3=1 indicates that L1 and L2 store valid data. If L3=0, then L1 and L2 do not store valid data. In step 1006, for NAND strings having L1=1, maintain L3=0.

In step 1008, a read process is performed for the selected word line using a second set of word line (control gate) voltages as read points. One embodiment of step 1002 includes performing the process of FIG. 16; however, instead of using Vra, Vrb and Vrc, a different set of thee compare voltages are used. For example, Vra+offset, Vrb+offset and Vrc+offset can be used; Vra−offset, Vrb−offset and Vrc−offset can be used; or another set of three compare voltages can be used.

In step 1010, the latches 494 that store the results from measuring the resistance information (see step 954 of FIG. 13) are read to see how the NAND strings have been classified. If a particular latch (or set of latches) stores data indicating that its corresponding NAND string is in a high resistance state, then the data from step 1008 is stored in latches 494 (step 1012) as the final read data for the corresponding NAND string as a result of the process of FIG. 15.

In one example implementation of steps 1010 and 1012, NAND strings having L3=1 do not store final data in step 1012 and their data previously stored in step 106 is left undisturbed. NAND strings having L3=0 and L1=1, will store the data from step 1008 in L1 and L2, and will also then set L3=1.

Note that the process of FIG. 15 assumes the use of two conditions: low resistance and high resistance. However, more than two conditions can be used. If more than two conditions are used, then steps 1008-1012 should be repeated for the additional sets of read points associated with the additional conditions.

Shifts in the apparent threshold voltage of a floating gate (or other charge storing element) of a non-volatile memory cell can occur because of the coupling of an electric field based on the charge stored in neighboring floating gates (or other neighboring charge storing elements). The problem occurs most pronouncedly between sets of adjacent memory cells that have been programmed at different times. To account for this coupling, the read process for a target memory cell will provide compensation to a neighbor memory cell in order to reduce the coupling effect that the neighbor memory cell has on the particular memory cell. One embodiment also includes setting up, during the verification process, the required conditions for the later application of compensation to the neighbor memory cell. In such an embodiment the overdrive voltage applied to WLn+1 (depicted in FIG. 11 as VrdX) is reduced from a typical value (e.g., 5.5V) down to, for example, 3V. Thus, during a verification process, VrdX is 3 volts (or another suitable value that depends on the implementation). The compensation provided when subsequently reading will consist of application of higher voltage, as compared to that voltage that was applied during the verify phase, to WLn+1 during the read operation performed on WLn.

To determine how much compensation should be provided to the neighbor memory cell when reading a target memory cell, the system described herein determines a perceived condition of the memory cell from a set of potential conditions planned for in advance. For example, looking at FIG. 7, the system will determine whether the neighbor memory cell is in states E, A, B or C. The use and magnitude of the compensation will be based on which state the neighbor memory cell is in.

Figure 17:
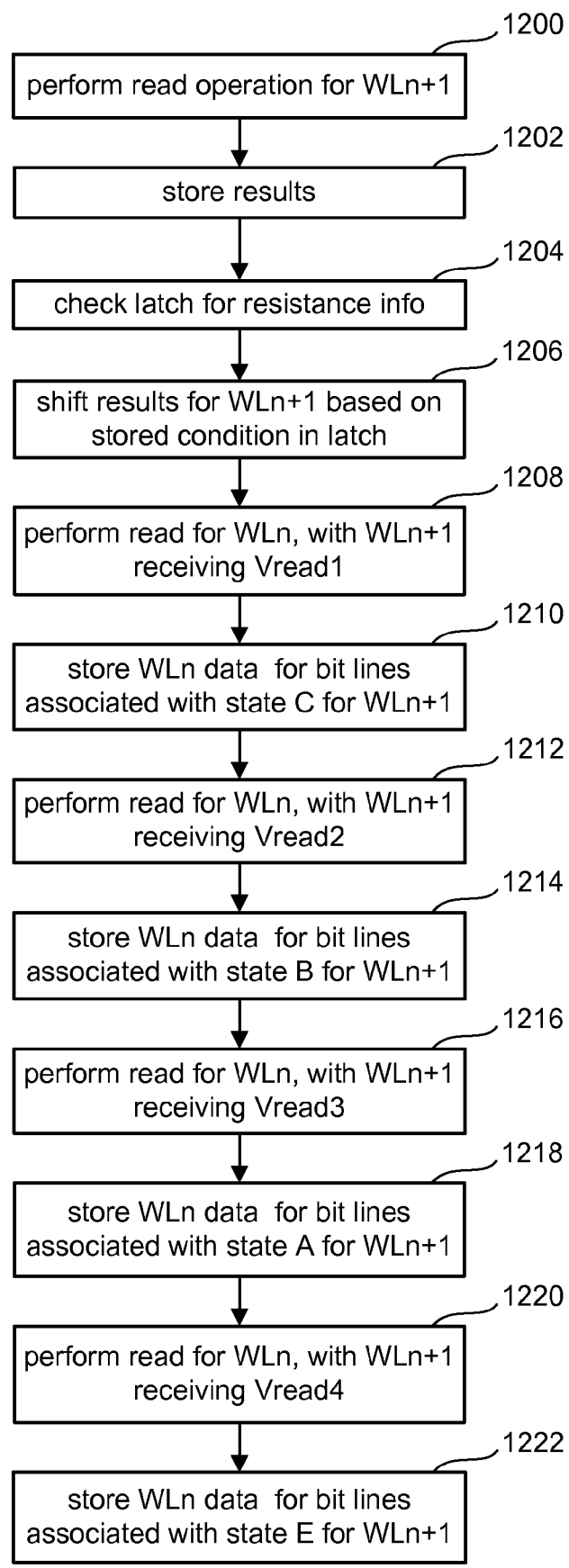
FIG. 17 depicts a flow chart describing one embodiment of a process for performing a plurality of read operations.

FIG. 17 includes a flow chart describing one embodiment of a process for reading data while compensating for the floating gate to floating gate coupling effect (or another cause of error). The compensation includes looking at the neighboring word line and determining how the programming of the neighboring word line has created a floating gate to floating gate coupling effect. For example, when reading data on word line WLn (e.g., WL2), the process will also read the data of word line WLn+1 (e.g., WL3). If the data on word line WLn+1 has caused an apparent change in the data on WLn, then the read process will compensate for that change.

The process depicted in FIG. 17 applies to the full sequence programming described above with respect to FIG. 7 in which two bits of data are stored in each memory cell and will be read and reported out together. If the memory cell on the neighboring word line is in state E, there will be no floating gate to floating gate coupling effect. If the memory cell on the neighboring word line is in state A, there will be a small coupling effect. If the memory cell on the neighboring word line is in state B, there will be a medium floating gate to floating gate coupling effect. If the memory cell on the neighboring word line is in state C, there will be a larger floating gate to floating gate coupling effect. The exact coupling effect due to the neighboring word line varies by array implementation and can be determined by characterizing the device.

Step 1200 of FIG. 17 includes performing a read operation (FIG. 11, with Vrdx=Vread) for the neighboring word line WLn+1. The results of step 1200 are stored in the appropriate latches in step 1202. In some embodiments, the read operation performed for WLn+1 results in determining the actual data stored on WLn+1, which indicates the states (e.g., E, A, B, C) that the corresponding memory cells are in. In other embodiments, the read operation performed for WLn+1 results in a determination of charge levels on WLn+1, which may or may not accurately reflect the data stored on WLn+1.

In step 1204, processor 492 checks the latch storing the data indicating the results from measuring the resistance information (e.g., L1=0 corresponds to low resistance condition and L1=1 corresponds to high resistance condition). If a particular NAND string is in a high resistance condition (L1=1), then the indication of the data from WLn+1 is shifted one data state in step 1206. So, if the neighbor memory cell is in state A and the NAND string is in a high resistance condition, then shift the indication of the neighbor's state to indicate state B. In one embodiment, this includes changing the data in one or more latches storing the indication of the neighbor's state. Extra latches may be needed for this process.

In step 1208, a read process is performed for the word line of interest WLn. This includes performing the process of FIG. 16 with VrdX=Vread1. In one embodiment, Vread1=Vread. Thus, all of the unselected word lines (see WL_unsel and WLn+1 of FIG. 11) are receiving Vread. This provides the maximum compensation as the compensation is determined by the difference between Vread value used on WLn+1 during read operations and the Vread value used earlier during the verify phase of program/verify. The results of step 1208 are stored (in step 1210) in the appropriate latches for bit lines with memory cells having a neighbor cell on WLn+1 in state C (as determined in step 1200, and possibly modified in step 1206). For other bit lines whose drain side neighbors are not being detected presently to be in state C, the data of this read of WLn which used Vread1 on WLn+1 will be disregarded.

In step 1212, a read process is performed for WLn. During that read process (FIG. 16), the drain side neighbor word line WLn+1 will receive Vread2. That is, VrdX=Vread2, where Vread2—4.9 v (or another suitable value). This delivers a smaller compensation amount appropriate for memory cells whose drain side neighbors are now in state B. In step 1214, the results of step 1212 will be stored for bit lines with memory cells having neighboring memory cells (e.g., WLn+1) in state B. Data for other bit lines will be disregarded.

In step 1216, a read process (FIG. 16) is performed for WLn. During that read process, the drain side neighbor word line WLn+1 will receive Vread3. That is, VreadX=Vread3, where Vread3=4.3 volts (or another suitable value). This delivers a smaller compensation amount appropriate for memory cells whose drain side neighbors are now in state A. In step 1218, the results of step 1216 will be stored for bit lines with memory cells having neighboring memory cells (e.g., WLn+1) in state A. Data for other bit lines will be disregarded.

In step 1220, a read process (FIG. 16) is performed for WLn. During that read process, the drain side neighbor word line WLn+1 will receive Vread4. That is, VreadX=Vread4, where Vread4=3.0 volts (or another suitable value). This delivers no compensation amount, which is appropriate for cells whose drain side neighbors are now in state E as they were at the time of program/verify. In step 1222, the results of step 1220 will be stored for bit lines with memory cells having neighboring memory cells (e.g., WLn+1) in state E. Data for other bit lines will be disregarded. In different implementations, different values of Vread1, Vread2, Vread3 and Vread 4 can be determined based on device characterization, experimentation and/or simulation. More information about using compensation for a neighbor memory cell can be found in U.S. patent application Ser. No. 11/384,057, "Read Operation for Non-Volatile Storage with Compensation for Coupling," filed Mar. 17, 2006, inventor Nima Mokhlesi, incorporated herein by reference.

The processes of FIGS. 15-17 can be adapted to read one page of data that has been programmed according to the programming schemes described above, as well as other programming schemes known in the art. For example, the process of FIG. 16 need only apply Vrb to a selected word line when reading the lower page of data programmed according to the method illustrated in FIGS. 8A-C. Additionally, with respect to the method illustrated in FIGS. 8A-C, if a neighbor memory cell does not have upper page data programmed, then one embodiment does not provide compensation to that neighbor memory cell when reading from the target memory cell. More information about reading data programmed according to the method illustrated in FIGS. 8A-C can be found in U.S. patent application Ser. No. 11/384,057, "Read Operation for Non-Volatile Storage with Compensation for Coupling," filed Mar. 17, 2006; U.S. Patent Publication 2006/0221714; and U.S. Patent Publication 2006/0140011.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for reading data from non-volatile storage, comprising:
   measuring resistance information for a group of connected non-volatile storage elements;
   choosing a read parameter in response to and based on the resistance information; and
   reading data from a non-volatile storage element of said group of connected non-volatile storage elements using said resistance information, including performing a read operation using the read parameter.

2. A method according to claim 1, wherein:
   said measuring resistance information includes classifying said group as pertaining to a high resistance state or a low resistance state; and
   said reading data includes choosing a read parameter based on whether said group has been classified as pertaining to said high resistance state or said low resistance state, said reading data using said resistance information includes performing a read operation using said read parameter.

3. A method according to claim 1, wherein:
   said reading data includes choosing a bit line voltage for said group based on said resistance information.

4. A method according to claim 1, wherein:
   said reading data includes choosing a control gate voltage for said non-volatile storage element based on said resistance information.

5. A method according to claim 1, wherein:
   said reading data includes choosing a time period for testing said non-volatile storage element.

6. A method according to claim 1, wherein:
   said reading data includes choosing a reference signal for testing current flow for said non-volatile storage element.

7. A method according to claim 1, wherein:
   said reading data includes providing compensation to a neighbor storage element of said non-volatile storage element while sensing from said non-volatile storage element.

8. A method according to claim 7, further comprising:
   determining condition information for said neighbor storage element, said condition information indicates a condition of said neighbor storage element; and
   adjusting said condition information if said resistance information indicates a first resistance condition for said group, said compensation is based on said condition information.

9. A method according to claim 7, further comprising:
   reporting said data.

10. A method according to claim 1, wherein:
    said group of connected non-volatile storage elements is a NAND string.

11. A method according to claim 10, wherein:
    said measuring resistance information includes applying a first voltage to a first subset of said group of connected non-volatile storage elements and applying a second voltage to a second subset of said group of connected non-volatile storage elements;
    said first subset includes said non-volatile storage element and other storage elements on said NAND string that are on a first side of said non-volatile storage element; and
    said second subset includes other storage elements on said NAND string that are on a second side of said non-volatile storage element.

12. A method according to claim 11, wherein:
    said group of connected non-volatile storage elements stores multiple bits of data in each non-volatile storage element of said group; and
    said resistance information is indicative of resistance of a portion of said NAND string.

13. A method for reading data from non-volatile storage, comprising:
    measuring resistance information for a plurality of NAND strings, each of said NAND strings includes a set of non-volatile storage elements;
    separately choosing a parameter value for each NAND string based on said resistance information; and
    performing one or more read operations on at least one non-volatile storage element for each NAND string using said parameter.

14. A method according to claim 13, wherein:
    said parameter value is a bit line voltage.

15. A method according to claim 13, wherein:
said parameter value is a word line voltage.

16. A method according to claim 13, wherein:
said performing one or more read operations uses a sense amplifier; and
said parameter value is provided to said sense amplifier.

17. A method according to claim 13, wherein:
each NAND string includes a target non-volatile storage element and a neighbor non-volatile storage element next to said target non-volatile storage element, said one or more read operations are performed on said target non-volatile storage element and include providing compensation to said neighbor non-volatile storage element while reading from said target non-volatile storage element;
said method further comprises determining condition information for said neighbor storage element, said condition information indicates a condition of said neighbor storage element; and
said method further comprises adjusting said condition information if said resistance information indicates a first resistance condition for a respective NAND string, said compensation is based on said condition information.

18. A method according to claim 13, wherein:
said measuring resistance information includes applying a first bit line voltage to said plurality of NAND strings;
said performing one or more read operations includes applying a second bit line voltage to said plurality of NAND strings; and
said second bit line voltage is greater than said first bit line voltage.

19. A method according to claim 13, wherein:
said measuring resistance information includes using a first integration time for said plurality of NAND strings;
said performing one or more read operations includes using a second integration time for said plurality of NAND strings; and
said second integration time is longer than said first integration time.

20. A method for reading data from non-volatile storage, comprising:
measuring resistance information for a group of connected non-volatile storage elements, said group of connected non-volatile storage elements includes a target non-volatile storage element and a neighbor non-volatile storage element that is next to said target non-volatile storage element;
determining condition information for said neighbor non-volatile storage element, said condition information is indicative of a condition of said neighbor non-volatile storage element; and
performing one or more read operations for said target non-volatile storage element while providing compensation to said neighbor non-volatile storage element, said compensation is based on said condition information and said resistance information.

21. A method according to claim 20, wherein:
said condition information indicates a data state of said neighbor non-volatile storage element.

22. A method according to claim 20, wherein:
said group of connected non-volatile storage elements is a NAND string; and said resistance information is indicative of resistance of a portion of said NAND string.

23. A method of sensing resistance information for non-volatile storage, comprising:
applying a first voltage to a first subset of non-volatile storage elements on a NAND string;
applying a second voltage to a second subset of non-volatile storage elements on said NAND string; and
sensing resistance information for said NAND string based on a current flowing in said NAND string in response to applying said first voltage and said second voltage.

24. A method according to claim 23, wherein:
said steps of applying said first voltage and applying said second voltage are part of a process that reads data from a target non-volatile storage element on said NAND string;
said first subset of non-volatile storage elements includes said target non-volatile storage element and other non-volatile storage elements of said NAND string on a first side of said target non-volatile storage element; and
said second subset of non-volatile storage elements includes non-volatile storage elements of said NAND string on a second side of said target non-volatile storage element.

25. A method according to claim 24, wherein:
said first voltage is applied to a control gate for said first subset of non-volatile storage elements; and
said second voltage is applied to a control gate for said second subset of non-volatile storage elements.

* * * * *

UNITED STATES PATENT AND TRADEMARK OFFICE
CERTIFICATE OF CORRECTION

| | | |
|---|---|---|
| PATENT NO. | : 7,590,002 B2 | Page 1 of 1 |
| APPLICATION NO. | : 11/617972 | |
| DATED | : September 15, 2009 | |
| INVENTOR(S) | : Mokhlesi | |

It is certified that error appears in the above-identified patent and that said Letters Patent is hereby corrected as shown below:

Col. 24, line 10: after "for" and before "non-volatile" delete ".said" and substitute therefore --said--

Signed and Sealed this

Nineteenth Day of January, 2010

David J. Kappos
*Director of the United States Patent and Trademark Office*